United States Patent
Jin

(10) Patent No.: US 7,460,616 B2
(45) Date of Patent: Dec. 2, 2008

(54) METHOD OF BLIND CHANNEL SEARCHING AND ESTIMATION USING A FAST FOURIER TRANSFORM MECHANISM

(75) Inventor: Yue-Hai Jin, Taipei (TW)

(73) Assignee: Ali Corporation, Taipei (TW)

( * ) Notice: Subject to any disclaimer, the term of this patent is extended or adjusted under 35 U.S.C. 154(b) by 597 days.

(21) Appl. No.: 11/172,800

(22) Filed: Jul. 5, 2005

(65) Prior Publication Data

US 2006/0037059 A1 Feb. 16, 2006

(30) Foreign Application Priority Data

Aug. 10, 2004 (TW) .............................. 93123914 A

(51) Int. Cl.
  *H04L 27/00* (2006.01)
(52) U.S. Cl. ..................................................... 375/316
(58) Field of Classification Search ................ 375/316, 375/324, 326, 328, 338, 345, 346, 240.18; 342/196; 708/404, 405; 379/406.13; 370/210; 725/118, 123
See application file for complete search history.

(56) References Cited

U.S. PATENT DOCUMENTS 5,930,295 A * 7/1999 Isley et al. ................... 375/219
6,720,824 B2 * 4/2004 Hyakudai et al. ............ 329/304
7,308,286 B2 * 12/2007 Felter ....................... 455/562.1
2001/0055271 A1 * 12/2001 Okada et al. ................ 370/206
2005/0141630 A1 * 6/2005 Catreux et al. .............. 375/267

\* cited by examiner

*Primary Examiner*—Sam K Ahn
(74) *Attorney, Agent, or Firm*—Birch, Stewart, Kolasch & Birch, LLP

(57) ABSTRACT

A FFT-based blind channel searching and estimation method, comprising the steps of waiting for a power-on signal from a DVB-S receiver, judging whether a complex of automatic gain control signals of the receiver have converged, producing a complex of data samples by utilizing the FFT, calculating energy after the FFT and accumulating the energy to be saved to the memory of the DVB-S receiver, detecting whether sample times exceed a predetermined value, filtering a complex of signal noises after accumulation with a filter, judging whether a channel of the channel has been searched, finishing searching and calculating to produce a symbol speed and a center frequency shift, and enabling a decoder action. The present invention is applied for a DVB-S receiver to effectively decrease the time required to complete a blind search and guarantees that an exact signal in a DVB-S receiver is found.

20 Claims, 3 Drawing Sheets

METHOD OF BLIND CHANNEL SEARCHING AND ESTIMATION USING A FAST FOURIER TRANSFORM MECHANISM

BACKGROUND OF THE INVENTION

1. Field of the Invention

The present invention relates to blind channel searching and estimation using a fast Fourier transform (FFT) mechanism, and, more particularly, using an FFT-based mechanism during blind channel searching to effectively decrease the time required to complete a blind search. This method also guarantees that an exact signal in a DVB-S receiver is found.

2. Description of Related Art

A digital platform is mainly used in digital TV. A digital platform is not just hardware, such as a set-top box or a TV, but also includes digital channels and digital content. High-quality digital content attracts viewers and encourages further development of digital content. Currently, global digital TV specifications are divided into two types: advanced television systems committee (ATSC) in the North America and digital video broadcasting (DVB) in Europe.

DVB systems are further separated into digital video broadcasting cable (DVB-C), digital video broadcasting satellite (DVB-S) and digital video broadcasting terrestrial (DVB-T). DVB-C is designed to meet the specifications for cable TV. DVB-S is designed to meet the specifications for satellite TV. DVB-T is designed to meet the specifications for terrestrial TV.

A local system provider can transmit signals, such as digital video broadcasting-S, to a user's satellite dish up to 22000 miles away via satellite. The transmission method uses quaternary phase shift keying (QPSK) to transmit MPEG-2 data.

A full blind channel search is necessary for a DVB-S receiver. A full blind channel search provides a sample operation mode without requiring a user to know program information. A full blind channel search automatically scans all programs. The search's speed is a key point for measuring a blind search algorithm and a fast search reduces waiting time.

The blind search method is based on back end software control of the prior art. A center frequency is set in a tuner. A filter bank and a timing recovery loop are started in the base band decoder chip. The base band decoder chip operates at a minimum symbol speed. If the timing recovery loop is unable to converge, the symbol speed is increased. A symbol speed in excess of a maximum value and lacking convergence indicates a lack of signal at a particular frequency point. When this occurs, a center frequency in the tuner is refreshed. A longer frequency is added to the original and the above steps are repeated until the timing recovery loop converges.

This method is disadvantageously slow. The symbol speed ranges from 1 Mbaud to 45 Mbaud and is very large. The channel of a satellite signal is width. The channel has 950 MHz-2150 MHz input ranges in a Ku tuner. The symbol speed and the channel of the satellite signal are the combination of many products. A blind search leads to longer search times for multiple combinations. Furthermore, to change the center frequency of tuner wastes a lot of time. The distance longer center frequency extends the search time and the timing recovery loop convergence will be very slow. The search symbol speed is slow when using the timing recovery loop.

SUMMARY OF THE INVENTION

The primary objective of the present invention is to solve the problem with regard to faster frequency searching times on the DVB-S receiver of the prior art.

To achieve the above objective, the present invention provides a FFT-based blind channel searching and estimation method comprising the steps of waiting for a power-on signal from a receiver; judging whether a complex of automatic gain control signals of the receiver has converged; producing a complex data sample by utilizing FFT, wherein the complex of data samples being sampled are a complex of automatic gain control signals; calculating energy after the FFT has been utilized and accumulating the energy to be saved in the memory of the DVB-S receiver; detecting whether-sample times exceed a predetermined value; utilizing a filter to filtrate a complex of signal noises after they have been accumulated; judging whether a channel has been searched; finishing searching and performing a calculation to produce a symbol speed and a center frequency shift, and enabling a decoder action.

BRIEF DESCRIPTION OF THE DRAWINGS

The various objectives and advantages of the present invention will be more readily understood from the following detailed description when read in conjunction with the appended drawings, in which.

DETAILED DESCRIPTION OF PREFERRED EMBODIMENTS

The present invention uses a channel characteristic to search channels and estimate parameters, wherein the channel is obtained by FFT. The statistics value of the channel runs along the center of an axis symmetrically, wherein the signal is regulated. If the signal is used as a root raised cosine waveform, such as a satellite TV standard, the signal forms a symbol speed. The symbol speed is the distance between two-3 dB attenuation points on the energy channel. If the result is not used as a symbol speed, the symbol speed will be either a root-raised cosine or it will be the distance between two edge points. When the channel is between the two edge points, the symbol speed can be calculated and the frequency shift on the center carrier can be found. The blind search will stop when a turner signal is divergent before the turner module of the DVB-S receiver is activated.

Figure 1:
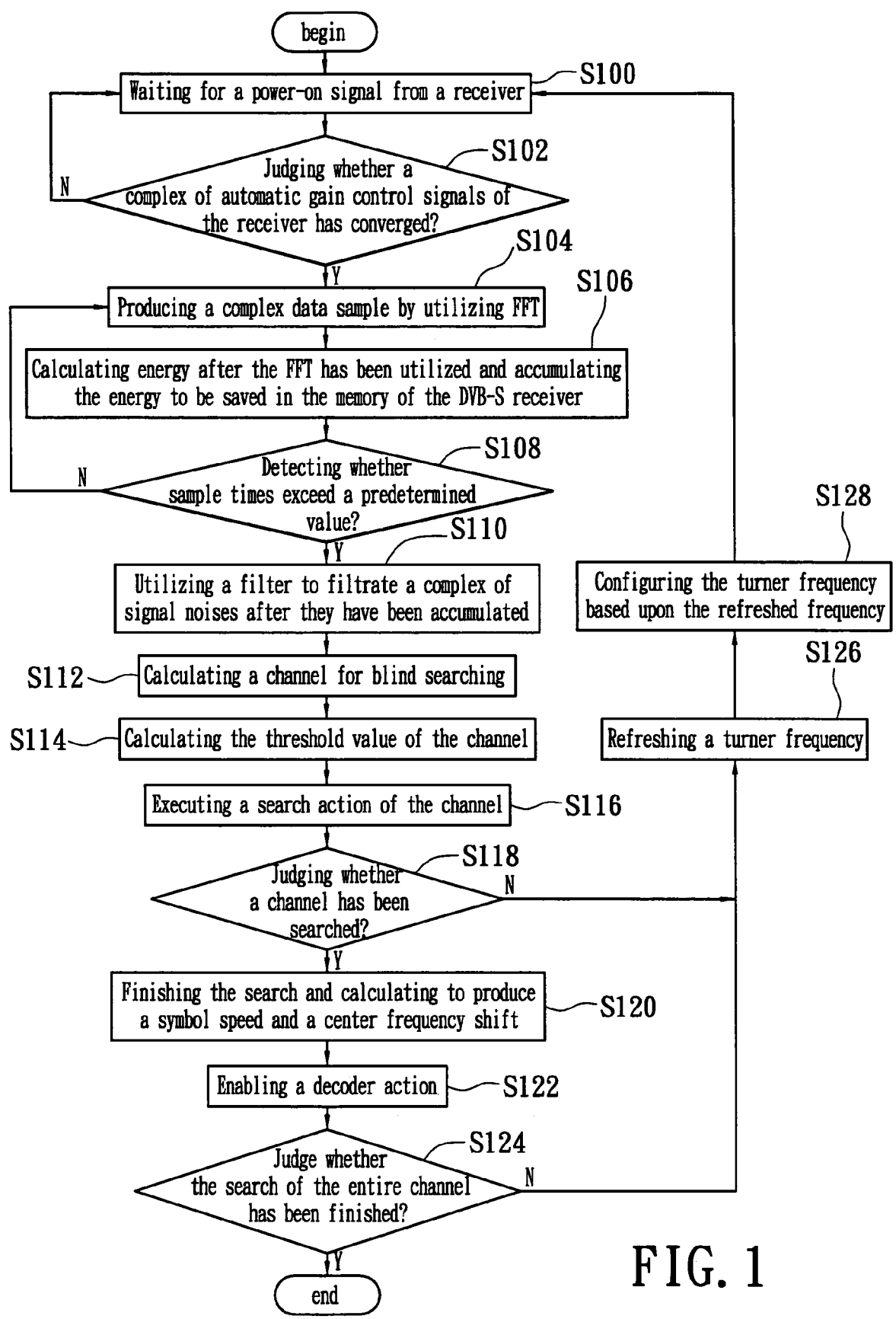
FIG. 1 is a flowchart of an FFT-based blind channel search and estimation method of the present invention.

FIG. 1 is a flowchart of the FFT-based blind channel search and estimation method of the present invention. The method comprises of waiting for a power-on signal from a receiver (S100); judging whether a complex of automatic gain control signals of the receiver have converged (S102); if the result is yes, then producing a complex of data samples by utilizing the FFT mechanism (S104), wherein the complex of data samples being sampled are the complex of automatic gain control signals; if the result is no, then returning to the step of S100; calculating the energy after the FFT and accumulating the energy to be saved to the memory of the DVB-S receiver (S106); detecting whether the sample times of the data sample exceed a predetermined value (S108), wherein the predetermined value is twenty; if the detected result in step S108 is yes, then the complex of signal noises are filtered with a filter after accumulation (S110); if the detected result in step S108 is no, then returning to step S104; calculating a channel for blind searching (S112); calculating a threshold value of the channel (S114), wherein the threshold value includes a maximum value and a minimum value; executing a search action of the channel (S116); judging whether a channel has been searched (S118); if the result is yes, then finishing searching and performing a calculation to produce a symbol speed and a center frequency shift (S120); enabling a decoder action (S122); judging whether the search action for the entire channel is finished (S124); if the result of step S118 is no, then refreshing a turner frequency (S126); configuring the turner frequency based upon the refreshed frequency (S128); if the result of step S124 is yes, then ending the process; otherwise, if the result of step S124 is no, then refreshing the turner frequency (S126); and configuring the turner frequency based upon the refreshed frequency (S128).

Figure 2A:
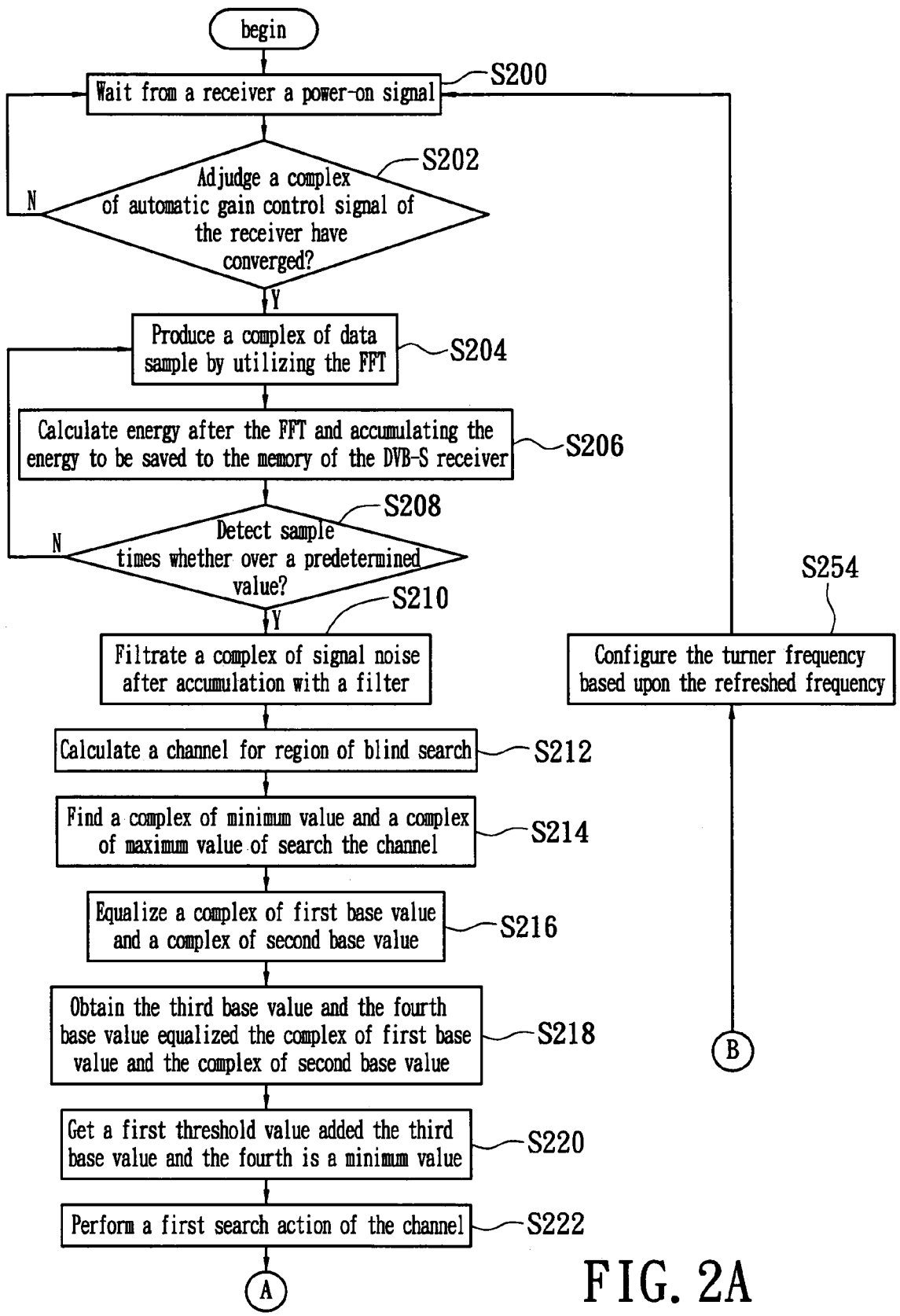
FIGS. 2a and 2b are flowcharts of an FFT-based blind channel search and estimation method of the preferred embodiments of the present invention.
Figure 2B:
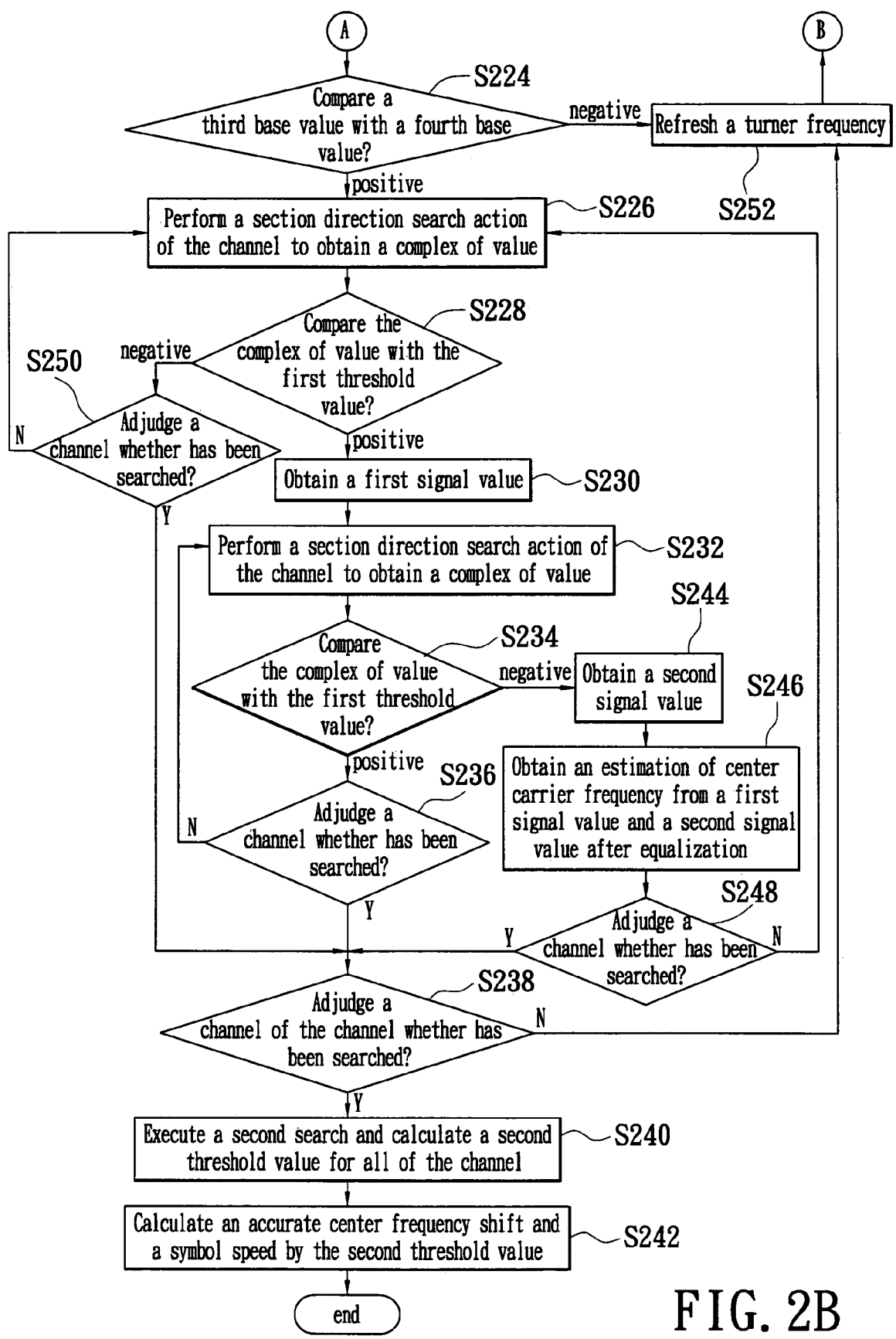

FIGS. 2a and 2b are flowcharts of a very fast FFT-based blind channel search and estimation method of the preferred embodiments of the present invention. The method comprises of the steps of waiting for a power-on signal from a receiver (S200); judging whether a complex of automatic gain control signals of the receiver have converged (S202); if the answer is yes, then producing a complex of data samples by utilizing an FFT mechanism (S204), wherein the complex of data samples being sampled are the complex of automatic gain control signals; using an FFT mechanism to obtain 1024 bits of sample data, wherein the sample rate of the sample data is 90 MHz in DVB-S decoder chips, the signal frequency width is 90 MHz after FFT and the resolution is 90 MHz divided by 1024 bits (equal to 87.89 KHz); calculating the energy after the FFT and accumulating the energy to be saved to the memory of the DVB-S receiver (S206); using FFT to obtain 1024 bits of sample data and getting the energy result; adding the previously obtained energy result and saving the energy result after adding the energy result twenty times, after the energy result has been added and saved it is used to equalize random signals; if the result of step S202 is no, then returning to the step of S200; detecting whether the sample times exceed a predetermined value (S208), wherein the predetermined value is twenty; if the result is yes, then filtering with a filter a complex of signal noises after they have been accumulated (S210); otherwise, if the result is no, then returning to the step of S204, the effect of by-passing the frequency filter is to sharply reduce burrs of the channel data and processes the reduced burrs at a later stage; calculating a channel for blind searching (S212), the turner output signal is passed through an analog filter, so bandwidths of the analog filter are sometimes under 45 MHz. The real region of the search is determined by the analog filter bandwidth. As such, it is uncertain—from −45 MHz to +45 MHz; finding a complex of minimum values and a complex of maximum values of the searched channel (S214); averaging a complex of first base values and a complex of second base values (S216), wherein the complex of the first base values are maximum values and the complex of the second base values are minimum values; passing the complex of first base values and the complex of second base values through a filter to obtain the third base values and the fourth base values (S218), wherein the third base values are maximum values and the fourth base values are minimum values; obtaining a first threshold value by adding the third base (maximum) value and the fourth base (minimum) value (S220), wherein the first threshold value is a signal-to-noise ratio and the first threshold calculation formula is (the third base value/4+the fourth base value×3/4); performing a first search action of the channel (S222), the objective being to confirm whether there is a signal and confirm the signal's center position in 90 MHz (assuming the analog filter bandwidth is 45 MHz); comparing a third base value with a fourth base value (S224); subtracting the fourth base value from the third base value to obtain the difference, if the result is positive, then a section direction search action of the channel is performed to obtain a complex of values (S226); otherwise, if the result is negative, then a turner frequency is refreshed (S252); configuring the turner frequency based upon the refreshed frequency (S254); and ending the search of the 90 MHz band.

In the step of S226, the section direction is from a negative section direction to a positive section direction or from a positive section direction to a negative section direction. The complex of values is compared with the first threshold values to obtain a result (S228); if the result is positive, then a first signal value is obtained (S230), wherein the first signal value is a rise clock signal; if the result is negative, judging whether a channel has been searched (S250); if the result is yes, judging whether a channel of the channel has been searched (S238); otherwise, if the result is no, then returning to the step of S226.

In step (S232) a section direction search action of the channel is performed to obtain a complex of values. The complex of values is compared with the first threshold value (S234); if the result is positive, then judging whether a channel has been searched (S236); otherwise, if the result is negative, then a second signal value is obtained (S244), wherein the second signal is a down clock signal.

In the step of S236, if the result is yes, judging whether a channel of the channel has been searched (S238); otherwise, if the result is no, then returning to the step of S232; obtaining an estimation of a center carrier frequency from a first signal value and a second signal value after equalization (S246); judging whether a channel has been searched (S248); if the result is yes, then judging whether a channel of the channel has been searched (S238); otherwise, if the result is no, then returning to step S226.

If the result in the step of S238 is yes, then executing a second search and calculating a second threshold value for all of the channels (S240); calculating an accurate center frequency shift and a symbol speed by the second threshold value (S242), wherein the second threshold includes a maximum value and a minimum value. The second threshold value calculation formula is (the maximum value−the minimum value)/2 added to the minimum or (the maximum value+the minimum value)/2. If the result in step S238 is no, then refreshing a turner frequency (S252); configuring the turner frequency based upon the refreshed frequency (S254). The first threshold value is obtained via the first search that does not follow every signal noise rate change. Therefore, the first threshold value is not 3 dB attenuation points of the channel. The second threshold value is obtained via the second search that calculates the threshold value of each channel. This is achieved by firstly finding the channel via the first search. Next, an average of the complex of data points of the channel center carrier left (or right) is obtained to find the maximum value of the channel. The minimum value is obtained from the first search time. The threshold value of the channel is obtained via (the maximum value+the minimum value)/2 formula. The threshold value is searched from a negative band to a positive band. When the complex of values is larger than the threshold value, the signal of the raise clock is found. When the complex of values is smaller than the threshold value, the signal of the down clock is found. The raise clock and the down clock are 3 db attenuation values. The raise clock and the down clock are used to find the center carrier and the symbol speed of the channel. The first search searches the channel for the numbers (1 . . . N), the second search searches the channel for the numbers (1 . . . N−1), and so on.

Although the present invention has been described with reference to the preferred embodiments thereof, it will be understood that the invention is not restricted to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. A method of blind channel searching and estimation using fast Fourier transform (FFT), comprising:
    waiting for a power-on signal from a digital video broadcasting-S (DVB-S) receiver;
    judging whether a complex of automatic gain control signals of the receiver have converged;
    producing a complex of data samples by utilizing the FFT, wherein the complex of data samples being sampled are the complex of automatic gain control signals;
    calculating the energy after the FFT and accumulating energy to be saved to a memory of the DVB-S receiver;
    detecting whether sample times exceed a predetermined value;
    filtering with a filter a complex of signal noises after accumulation;
    judging whether a channel of an entire channel has been searched;
    finishing the step of searching and the step of calculating to produce a symbol speed and a center frequency shift, and
    enabling a decoder action.

2. The method in claim 1, wherein the step of judging whether a complex of automatic gain control signals, if the result is yes, then continuing the step of producing a complex of data samples by utilizing the FFT, otherwise, returning to the step of waiting for a power-on signal from a DVB-S receiver.

3. The method in claim 1, wherein the step of detecting whether sample times exceed a predetermined value, if the result is yes, then continuing the step of filtering with a filter a complex of signal noises after accumulation, otherwise, returning to the step of producing a complex of data samples by utilizing the FFT.

4. The method in claim 1, wherein the step of filtering with a filter a complex of signal noises after accumulation further comprises: calculating a channel for region of blind searching; calculating a threshold value of the channel, wherein the threshold value includes a maximum value and a minimum value; and executing a searching action of the channel.

5. The method in claim 1, wherein the step of judging whether a channel of the channel has been searched, if the result is no, further comprises: refreshing a turner frequency; configuring the turner frequency based upon the refreshed frequency.

6. The method in claim 1, wherein the step of enabling a decoder action further comprises judging whether the search action for the entire channel has been finished.

7. A method of blind channel searching and estimation for fast Fourier transform (FFT), comprising the steps of:
    waiting for a power-on signal from a digital video broadcasting-S (DVB-S) receiver;
    judging whether a complex of automatic gain control signals of the receiver have converged;
    producing a complex of data samples by utilizing the FFT, wherein the complex of data samples being sampled are the complex of automatic gain control signals;
    calculating energy after the FFT and accumulating the energy to be saved to the memory of the DVB-S receiver;
    detecting whether sample times exceed a predetermined value;
    filtering with a filter a complex of signal noises after accumulation;
    calculating a channel for a region of blind searching;
    performing a first search to find a first threshold value;
    comparing a third base value with a fourth base value;
    performing a first search action of the channel;
    performing a section direction search action of the channel to obtain a complex of values;
    comparing the complex of values with the first threshold value; and
    obtaining an estimation of center cater frequency from a first signal value and a second signal value after equalization.

8. The method in claim 7, wherein the step of judging an automatic gain control signal, if the result is yes, ten continuing the step of producing a complex of data samples by utilizing the FFT, otherwise, returning to the step of waiting for a power on signal from a DVB-S receiver.

9. The method in claim 7, wherein the step of detecting whether sample times exceed a predetermined value if the result is yes, then continuing the step of filtering with a filter a complex of signal noises after accumulation, otherwise, returning to the step of producing a complex of data samples by utilizing the FFT.

10. The method in claim 7, wherein the step of calculating a channel for a region of blind searching further comprises, searching the channel to obtain a complex of minimum values and a complex of maximum values.

11. The method in claim 7, wherein the step of performing a first search to find a first threshold value further comprises:
    equalizing a complex of first base values and a complex of second base values, wherein the complex of first base values is a maximum value and the complex of second base values is a minimum value;
    obtaining the average of the third base value and the fourth base value to obtain the complex of first base values and the complex of second base values, wherein the third base value is a maximum value and the fourth base value is minimum value; and
    obtaining a first threshold value equals the third base value and the fourth is a minimum value.

12. The method in claim 11, wherein the first threshold value is a signal-to-noise ratio and the first threshold calculate formula is (the third base value/4+the fourth base value-.times.3/4).

13. The method in claim 7, wherein the step of comparing a third base value with a fourth base value, if the result is positive, then continuing the step of performing a first search action of the channel, otherwise, if the result is negative, then ending the blind searching of the channel.

14. The method in claim 7, wherein the section direction is from a negative section direction to a positive section direction or from a positive section direction to a negative section direction.

15. The method in claim 7, wherein the step of comparing the complex of values with the first threshold value if the result is positive, then obtaining a first signal value, otherwise, if the result is negative, then obtaining a second signal value.

16. The method in claim 15, wherein the first signal value is a rise clock signal and the second signal value is a down clock signal.

17. The method in claim 7, wherein the step of obtaining an estimation of center carrier frequency further comprises: judging whether a channel has been searched; judging whether a channel of the channel has been searched; executing a second search and calculating a second threshold value for all of the channels, wherein the second threshold includes a maximum value and a minimum value; and calculating an accurate center frequency shift and a symbol speed by the second threshold value.

18. The method in claim 17, wherein the step of judging whether a channel has been searched, if the result is yes, then continuing the step of judging whether a channel of the channel has been searched, otherwise, if the result is no, then returning to the step of performing a section direction search action of the channel to obtain a complex of values.

19. The method in claim 17, wherein the step of judging whether a channel of the channel has been searched if the result is yes, then continuing the step of executing a second search and calculating a second threshold value for all of the channels, otherwise, if the result is no, further comprises: refreshing a turner frequency; configuring the turner frequency based upon the refreshed frequency.

20. The method in claim 17, wherein the second threshold value calculation formula is (the maximum value−the minimum value)/2 added to the minimum or (the maximum value+the minimum value)/2.

* * * * *